(12) United States Patent
Hanson

(10) Patent No.: US 11,448,710 B2
(45) Date of Patent: Sep. 20, 2022

(54) REGENERATIVE LOAD BANK SYSTEMS AND METHODS

(71) Applicant: Hamilton Sundstrand Corporation, Charlotte, NC (US)

(72) Inventor: Michael J. Hanson, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/354,544

(22) Filed: Mar. 15, 2019

(65) Prior Publication Data
US 2020/0292627 A1    Sep. 17, 2020

(51) Int. Cl.
| | |
|---|---|
| *H02M 1/00* | (2006.01) |
| *H02M 7/217* | (2006.01) |
| *H02M 1/088* | (2006.01) |
| *H02M 1/32* | (2007.01) |
| *G01R 31/42* | (2006.01) |
| *G01R 31/317* | (2006.01) |
| *H02M 7/219* | (2006.01) |

(52) U.S. Cl.
CPC ....... *G01R 31/42* (2013.01); *G01R 31/31721* (2013.01); *H02M 7/219* (2013.01); *H02M 1/0012* (2021.05); *H02M 1/0054* (2021.05); *Y02B 70/10* (2013.01)

(58) Field of Classification Search
CPC . G01R 31/42; G01R 31/31721; H02M 7/219; H02M 1/0012; H02M 1/0054; H02M 1/327; H02M 7/217; H02M 1/088; Y02B 70/10
See application file for complete search history.

(56) References Cited

U.S. PATENT DOCUMENTS

| | | | |
|---|---|---|---|
| 6,614,231 B2* | 9/2003 | Thrap | G01R 31/42 |
| | | | 324/416 |
| 6,775,160 B2 | 8/2004 | Siri | |
| 7,405,553 B1 | 7/2008 | Kattoju | |
| 7,429,855 B2 | 9/2008 | Rozman | |
| 8,604,822 B2 | 12/2013 | Schroeder et al. | |
| 9,634,512 B1* | 4/2017 | Kim | H02J 7/00 |
| 2013/0009700 A1* | 1/2013 | Deboy | H02J 3/381 |
| | | | 327/581 |
| 2017/0070056 A1* | 3/2017 | Dickey | H02J 4/00 |

* cited by examiner

*Primary Examiner* — Lee E Rodak
*Assistant Examiner* — Joseph O Nyamogo
(74) *Attorney, Agent, or Firm* — Locke Lord LLP; Scott D. Wofsy; Alicia J. Carroll

(57) ABSTRACT

A regenerative load system includes a voltage input and a load current regulator electrically connected to the voltage input. The system includes a fly back rectifier electrically connected to the load current regulator. A current output is electrically connected to the fly back rectifier. A system for regeneratively testing electrically powered equipment includes a power source. The system includes a unit under test (UUT) having a voltage input electrically connected to the power source, a regenerative load system electrically connected to the UUT. The regenerative load system (RLS) includes a RLS voltage input electrically connected to the UUT, a load current regulator electrically connected to the RLS voltage input, a fly back rectifier electrically connected to the load current regulator, and a current output electrically connected to the fly back rectifier. The current output is configured and adapted to provide current the UUT and/or the power source.

16 Claims, 4 Drawing Sheets

REGENERATIVE LOAD BANK SYSTEMS AND METHODS

BACKGROUND OF THE INVENTION

1. Field of the Invention

The present disclosure relates to load bank systems, and more particularly to load bank systems for regeneratively testing electrically powered equipment.

2. Description of Related Art

Vehicles such as aircraft commonly include electrical components and assemblies that are tested prior to use. For example, power distribution equipment is typically tested by simulating the downstream utilization equipment with a load bank. The equipment under test is referred to as a unit under test (UUT). The load provided from the UUT to the load bank typically represents what will be observed while in service. To test these electrical components and assemblies, power from the power grid or other power supply is provided to the UUT and then is distributed to the load bank. The energy delivered to the load bank is typically dissipated, as heat, back into the environment. A UUT with many outputs can distribute tens-of-kilowatts of power or more. Existing load banks tend to occupy excessive floor space and waste excessive power. In some cases, the need for liquid cooling drives cost and makes load banks non-portable. In air-cooled load banks, air conditioning is needed to remove excessive heat from the building in summer months. In traditional systems, in particular those for testing aircraft power distribution equipment, it is common to dump tens-of-kilowatts into the environment during test.

The issue of dissipating large amounts of power has been addressed in commercial applications. Regenerative load banks "regenerate" much of the power back into the utility mains (i.e. the power grid) instead of dissipating the power as heat (waste). In an aviation application, however, aircraft AC power is 400 Hz rather than 60 Hz. In some cases, variable frequency (VF) systems may provide AC power over a frequency range. The range can be as wide as 375 Hz to 800 Hz. Since the frequency range is different, dedicated AC supplies are required for testing aircraft power systems. In other industries, such as aviation electrical systems that are not 60 Hz, there is typically a power conversion stage to convert utility power to the appropriate frequency and voltage for test. A commercial regenerative load in these applications can tend to avoid dissipating load power as heat, but does not reduce the requisite capacity of the source power.

Such conventional methods and systems have generally been considered satisfactory for their intended purpose. However, as power needs grow and as industry grows more environmentally conscious, there is still a need in the art for improved load banks and associated systems. The present disclosure provides a solution for this need.

SUMMARY

A regenerative load system includes a voltage input and a load current regulator electrically connected to the voltage input. The system includes a fly back rectifier electrically connected to the load current regulator. A current output is electrically connected to the fly back rectifier.

In accordance with some embodiments, the load current regulator includes two transistors connected to one another in series. The transistors of the load current regulator can be field effect transistors (FETs) connected to one another in series. The fly back rectifier can include two transistors connected to one another in series. The transistors of the fly-back rectifier can be FETs connected to one another in series. In some embodiments, when a first of the two transistors of the fly back rectifier is on, a second transistor of the two transistors of the fly back rectifier is off. Each transistor of the fly back rectifier can be operatively connected to a respective gate drive. The system can include a common gate drive operatively connected to the load current regulator for PWM voltage control. The voltage input can be AC.

In accordance with another aspect, a system for regeneratively testing electrically powered equipment includes a power source. The system includes a unit under test (UUT) having a voltage input electrically connected to the power source, and a regenerative load system electrically connected to the UUT. The regenerative load system (RLS) includes a RLS voltage input electrically connected to the UUT, a load current regulator electrically connected to the RLS voltage input, a fly back rectifier electrically connected to the load current regulator, and a current output electrically connected to the fly back rectifier. The current output is configured and adapted to provide current to at least one of the UUT or the power source.

The load current regulator can include two transistors connected to one another in series. The transistors of the load current regulator can be field effect transistors (FETs) connected to one another in series. The fly back rectifier can include two transistors connected to one another in series. The transistors of the fly-back rectifier can be FETs connected to one another in series. In some embodiments, when a first of the fly back rectifier transistors is on, a second of the fly back rectifier transistors is off. Each transistor of the fly back rectifier can be operatively connected to a respective gate drive. The regenerative load system can include a gate drive operatively connected to the load current regulator for PWM voltage control. The power source can be AC.

In accordance with another aspect, a method for regeneratively testing electrically powered equipment includes outputting a voltage with a unit under test (UUT), receiving the voltage with a regenerative load system electrically connected to the UUT, and regulating a current through a load current regulator of the regenerative load system when both of two transistors of the load current regulator are in an ON position, and receiving the current in a voltage input of at least one of a power source or the regenerative load system.

In some embodiments, the method includes allowing the current through a fly back rectifier.

The method can include controlling a PWM voltage of the load current regulator with a gate drive. The transistors of the load current regulator can be field effect transistors (FETs) connected to one another in series. The fly back rectifier can include two transistors connected to one another in series. The transistors of the fly-back rectifier can be FETs connected to one another in series.

These and other features of the systems and methods of the subject disclosure will become more readily apparent to those skilled in the art from the following detailed description of the embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE EMBODIMENTS

Figure 1:
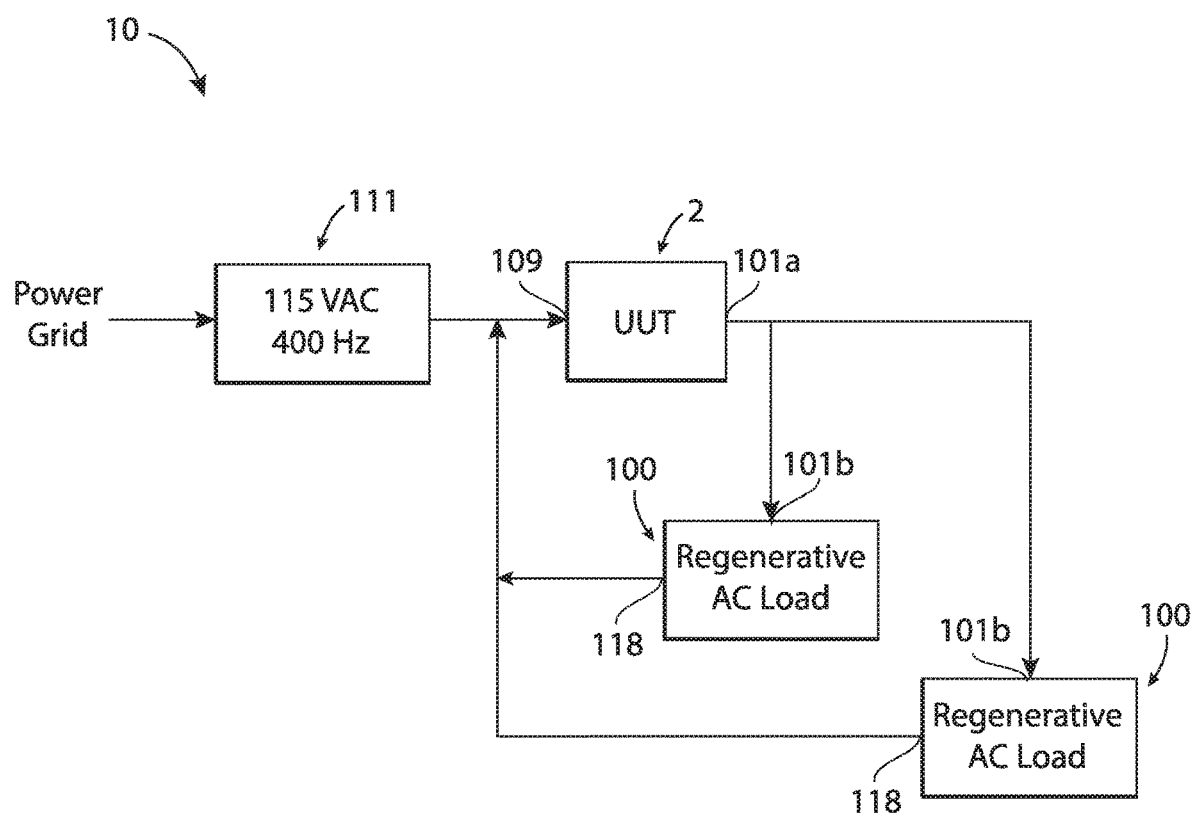
FIG. 1 is a schematic block diagram of an exemplary embodiment of a system constructed in accordance with the present disclosure for regeneratively testing equipment, showing the unit under test (UUT) electrically connected to the regenerative AC load system.

Reference will now be made to the drawings wherein like reference numerals identify similar structural features or aspects of the subject disclosure. For purposes of explanation and illustration, and not limitation, a schematic depiction of an exemplary embodiment of a system for regeneratively testing equipment, such as power distribution equipment, constructed in accordance with the disclosure is shown in FIG. 1 and is designated generally by reference character 10. Other embodiments of the system for regeneratively testing equipment constructed in accordance with the disclosure, or aspects thereof, is provided in FIGS. 2-4, as will be described. The systems and methods described herein can be used to regenerate power back to the unit under test in the system 10, instead of dissipating load energy into the environment, thereby reducing the size of the power source needed, and the cooling needed.

As shown in FIG. 1, a system 10 for regeneratively testing equipment, e.g. aircraft power distribution equipment, includes a unit under test (UUT) 2 that has a voltage output 101a. System 10 includes a regenerative load system (RLS) 100 having a voltage input 101b. RLS 100 is electrically connected to UUT 2 to receive the voltage therefrom by way of voltage input 101b. System 10 includes a power source 111 electrically connected to a voltage input 109 of UUT 2. A current output 118 of RLS 100 is electrically connected to voltage input 109 of UUT 2. In this way, in the embodiment of FIG. 1, power is fed back to the "feed" voltage, not the utility mains. RLS 100 thereby regenerates power back to UUT 2 which reduces the capacity required from power source 111 to maintain the voltage of the UUT, and the energy losses incurred by power source 111. It is also contemplated that multiple RLS units 100 can be used in conjunction with one another, as shown by the second RLS unit 100.

Those skilled in the art will readily appreciate that this tends to be particularly helpful where increased power is required, as the increased power, traditionally, would require increased floor space and cooling, among other things. As load voltages and currents grow, load banks and the need for power during tests will grow exponentially as will the need for liquid cooled banks and the need for floor space. RLS 100, however, can allow more than twenty times increase in power received from UUT 2, for the same use of electricity, air conditioning, and floor space required. In the embodiments shown and described herein, power source 111 is an alternating current (AC) power source 111 with a 115 volt AC output at 400 Hz. Those skilled in the art will readily appreciate that a variety of voltage and frequency levels can be used for power source 111, including DC voltage.

Figure 2:
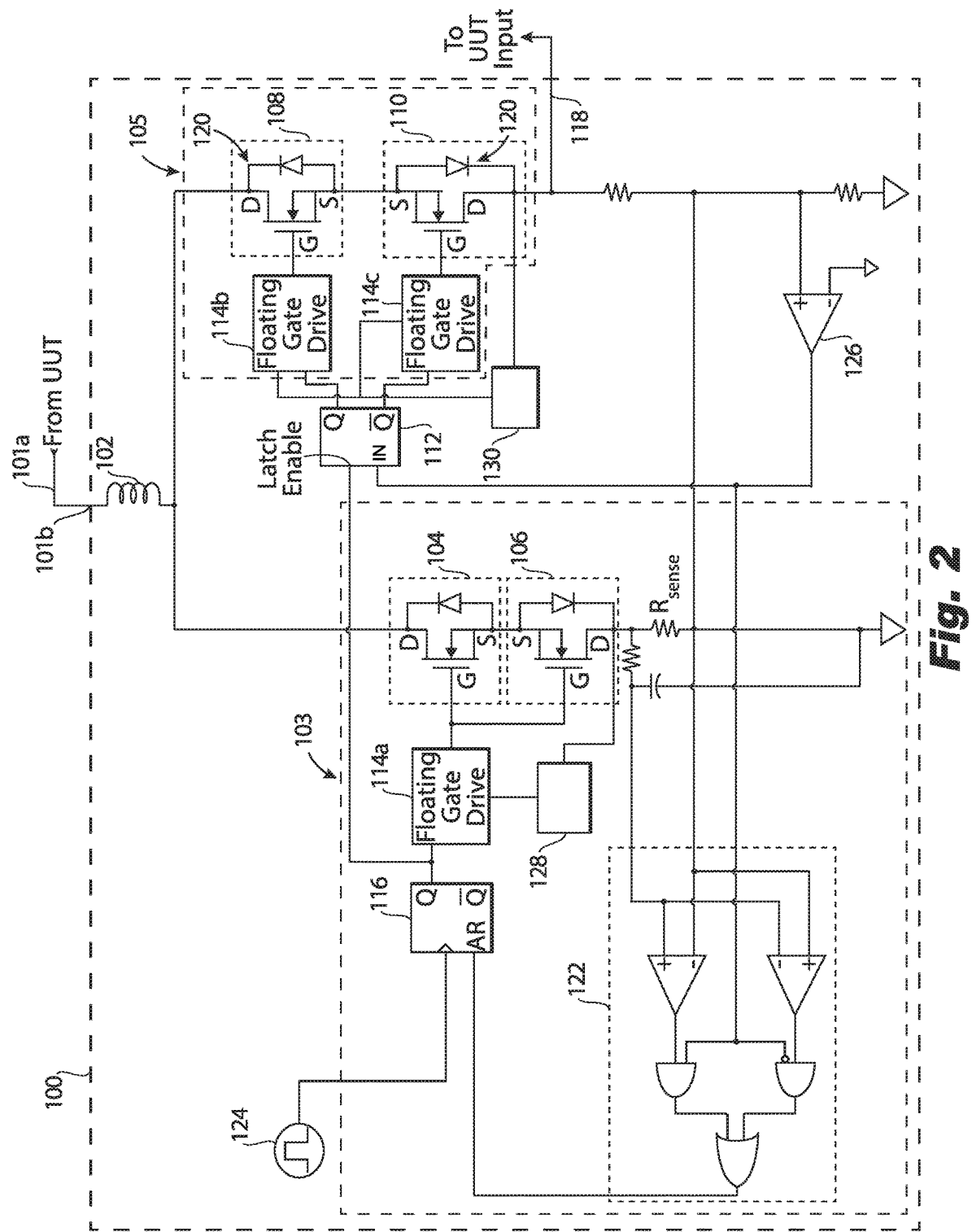
FIG. 2 is an electrical schematic of an embodiment of a regenerative load system (RLS) constructed in accordance with the present disclosure, showing the load current regulator and the fly-back rectifier.

With reference now to FIG. 2, RLS 100 includes a load current regulator 103 electrically connected to voltage input 101b and a fly back rectifier 105 electrically connected to load current regulator 103. An inductor 102 is positioned between UUT 2 and load current regulator 103. Current output 118 of RLS 100 is electrically connected to fly back rectifier 105 to receive current therefrom. In the embodiments of the present invention, fly back rectifier 105 is a floating rectifier. Load current regulator 103 includes two transistors 104 and 106, e.g. field effect transistors (FETs), connected to one another in series. RLS 100 includes a floating gate drive 114a operatively connected to load current regulator 103 for pulse width modulation (PWM) voltage control. Floating gate drive 114a controls both FET 104 and FET 106. Floating gate drive 114a is electrically connected to a PWM synchronizer 116 and, in turn, to the PWM frequency pulse generator 124. PWM synchronizer 116 includes asynchronous reset (AR), a first flip-flop output, active on the high voltage side, which is designated by "Q," and a second flip-flop output, active on the low voltage side, which is designated by A PWM frequency pulse generator 124 sends a pulse to floating gate drive 114a which triggers FETs 104 and 106 to turn on. FETs 104 and 106 of load current regulator 103 share common gate drive 114a and a gate drive power supply 128 because they turn on and off together.

With continued reference to FIG. 2, the primary losses of the current regulator 103 are switching losses since both FETs 104 and 106 are on at the same time, and neither body diode 120 of FETs 104 or 106 remains in conduction. In the embodiment of FIG. 2, no body diode forward drop is needed in this stage. The two FETs 104 and 106 share the losses by virtue of symmetry. One FET, e.g. FET 104, sees the PWM voltage during the positive AC feed half-cycle and the other FET, e.g. FET 106, sees the PWM voltage in the negative AC feed half-cycle. Current regulator 103 allows for switching of AC power by preventing the body diodes of the FETs 104 and 106 from conducting when FETs are OFF. Those skilled in the art will readily appreciate that this is accomplished by having two body diodes in series but opposite polarity. In contrast, in the fly-back rectifier, described below, the "OFF" FET does conduct through the body diode.

Those skilled in the art will readily appreciate that current regulator 103 can be floating, with a sense resistor between the FETs 104 and 106. This topology can be similar to AC solid-state power control. This tends to simplify the gate drive 114a, but requires communication between the floating regulator and the fly-back rectifier 105 to synchronize the zero-cross to the regulator "ON" time. In some embodiments, a microcontroller can be operatively connected to RLS 100 between the input for op-amp 126 and the input for 122. It would modify the shape of the voltage reference provided to 122. The microcontroller can define load/inductor current to allow for inrush simulation and test, and variable crest factor as would be seen in transformer rectifier units.

With continued reference to FIG. 2, fly back rectifier 105 includes two transistors 108 and 110, e.g. FETs 108 and 110, connected to one another in series. During the positive half cycle of the AC feed, the bottom FET 110 is on allowing a body diode 120 on the top FET 108 to become the fly-back diode. During the negative half cycle of the AC feed, the top FET 108 is on, allowing the body diode 120 of the bottom FET 110 to become the fly-back diode. In other words, whichever FET is "off" provides the fly back diode. The fly-back rectifier 105 does not include PWM voltage control like current regulator 103. Fly-back rectifier 105 switches between FETs 108 and 110 only on the AC voltage zero-cross, and only when current regulator 103 is conducting. Therefore, there are no significant switching losses in fly-back rectifier 105, the primary losses are the V*I drop of the body diodes 120 when conducting. The two FETs 110 and 108 share the losses since they have symmetric conduction losses. The forward drop of whichever body diode 120 is conducting is important in discharging the inductor current, assuring that inductor 102 sees a fly-back voltage. When a first of the two FETs of the fly back rectifier, e.g. FET 108, is on, a second FET of the two FETs, e.g. FET 110, of the fly back rectifier 105 is off. Each FET 108 and 110 of the fly back rectifier 105 is operatively connected to a respective gate drive 114b and 114c, respectively. Gate drives 114b and 114c signal their respective FETs 108 and 110 on or off depending on the signal from a phase de-multiplexer 112. Phase de-multiplexor 112 de-multiplexes the AC voltage phase into exclusive gate drive signals for gate drives 114b and/or 114c. De-multiplexor 112 is shown as a transparent latch, but those skilled in the art will readily understand that de-multiplexor 112 can be a "D-type" flip-flop instead. A first output of de-multiplexor 112 is active on the high voltage side, which is designated by "Q," and a second output of de-multiplexor 112 is active on the low voltage side, which is designated by "Q̄."

With continued reference to FIG. 2, an op-amp 126 is connected to a voltage output from the UUT 2 to determine which half-cycle the AC voltage is on (positive or negative). In turn, op-amp 126 sends a signal to phase de-multiplexor 112 which indicates which half-cycle the AC voltage is on (positive or negative) so that gate drives 114b and 114c know whether their respective FETs 108 and 110 should be on or off. In the fly-back rectification stage, e.g. the portion of RLS 100 with FETs 108 and 110, only one of the FETS 108 and 100 is on at a time, and the other FET conducts through its respective body diode 120. Because the FETs 108 and 110 are only switched at the AC voltage zero-cross, and not on a PWM pulse, the gate drive supply current from gate drive power supply 130 for this stage is very low, and fly-back rectifier gate drive power supply 130 can be very small.

Those skilled in the art will readily appreciate that FETs 104, 106, 108 and 110 can all be MOSFETs. MOSFETs provide a parasitic body diode, e.g. body diode 120, to assist in the power conversion. It is also contemplated that instead of FETs, other transistors, like insulated gate bipolar transistors (IGBTs) can be used. It is contemplated that embodiments that use IGBTs can also include external diodes, or could use an IGBT type that includes an intrinsic diode. The use of IGBTs may be beneficial in high power applications A method for regeneratively testing electrically powered equipment includes outputting a voltage through a current output, e.g. voltage output 101a, with a UUT, e.g. UUT 2. The method includes receiving the voltage with a RLS, e.g. RLS 100, by way of a voltage input, e.g. voltage input 101b, electrically connected to the UUT. The method includes regulating current through a load current regulator, e.g. load current regulator 103, of the RLS when both of the two FETs, e.g. FETs 104 and/or 106, of the load current regulator is an ON position. The method includes controlling a PWM voltage of the load current regulator with a gate drive, e.g. gate drive 114a. The method includes allowing the current from the load current regulator through a fly back rectifier, e.g. fly back rectifier 105. The method includes outputting a current from the fly back rectifier at a current output, e.g. current output 118, and receiving the current in a UUT input, e.g. a voltage input 109 of UUT 2.

Figure 3:
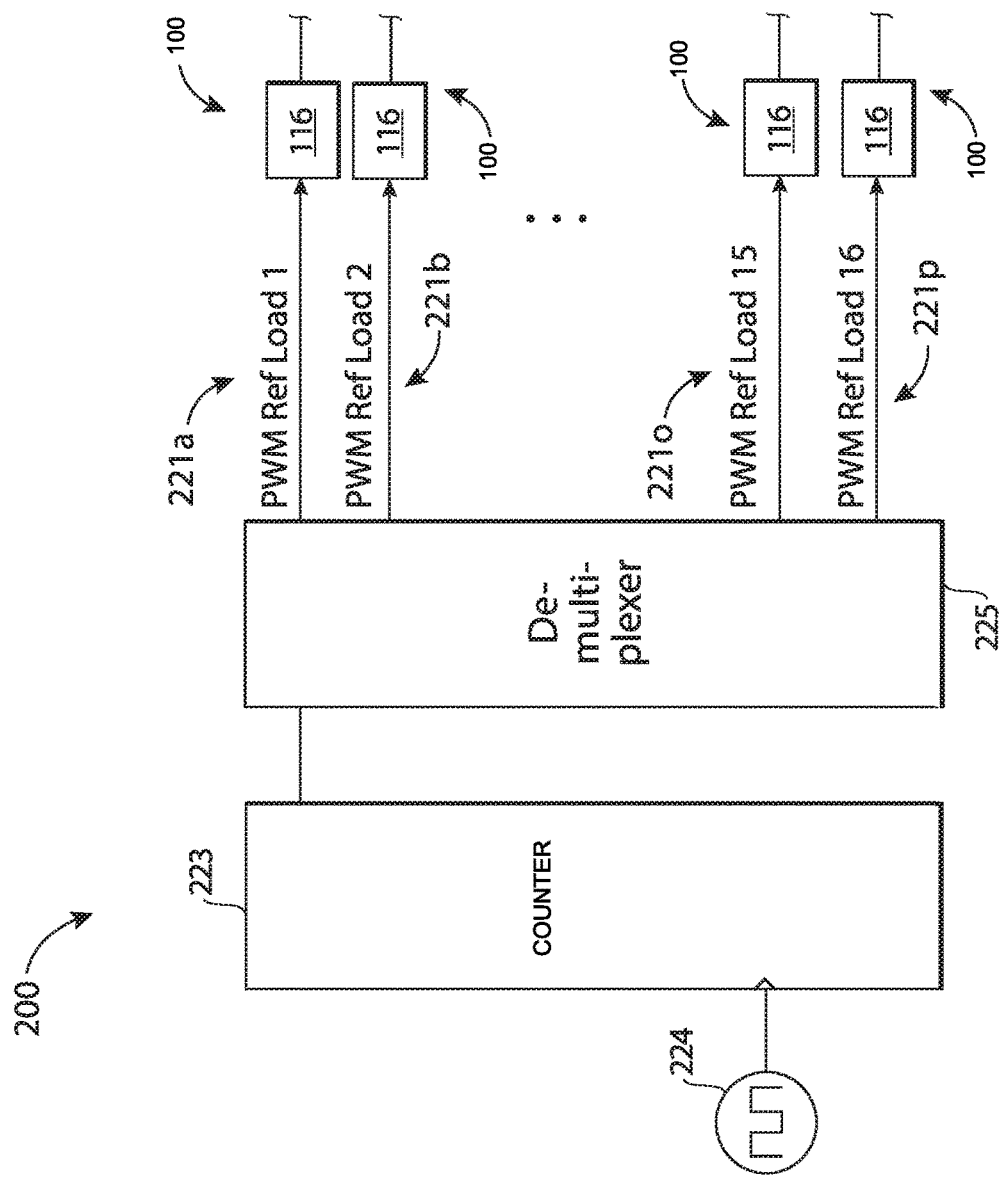
FIG. 3 is a schematic depiction of an embodiment of a common resource for multichannel load banks constructed in accordance with the present disclosure, showing a common pulse width modulation frequency pulse generator that is operatively connected to multiple load bank channels.

As shown in FIG. 3, some embodiments of system 100 include common resources for multi-channel RLS assemblies or "load banks" (represented by channels 221a-221p). RLSs rarely contain only one load, so some "economies of scale" are realizable. The common resources for multi-channel RLS assemblies include the control power for all comparators and flip-flops (where the common return is AC neutral), a zero-cross detector, a PWM oscillator with phase stagger, an oscillator for gate drive supplies, e.g. power supplies 128 and 130. FIG. 3 shows an example of PWM phase staggering to reduce the ripple current on the AC feed. A PWM oscillator 200 includes a PWM frequency pulse generator 224 (similar to 124), a counter 223 (up counter or down counter) operatively connected to the PWM frequency pulse generator 224, and a demultiplexer 225. Demultiplexer 225 is operatively connected between the counter 223 and a series of channels 221a-221p. In some embodiments, counter 223 provides a binary count output to de-multiplexer 225. Each channel 221a-221p is associated with a given RLS 100 (portions of which are shown in FIG. 3B). Where combined RLSs 100, e.g. those of FIG. 3, form a multi-channel RLS assembly and share a common PWM frequency pulse generator 224, each individual RLS 100 does not include PWM frequency pulse generator 124, as described above. Instead of each having a PWM pulse generator 124, they share a common PWM frequency pulse generator 224. Otherwise RLSs 100 of FIG. 3, are essentially the same as RLS shown in FIG. 2. It may be that not all RLSs 100 are powered at any given time. Individual loads can be paralleled to achieve greater UUT load. In the case of loads paralleled to achieve greater load capacity, staggering PWM references assists in reduction of feed ripple.

Figure 4:
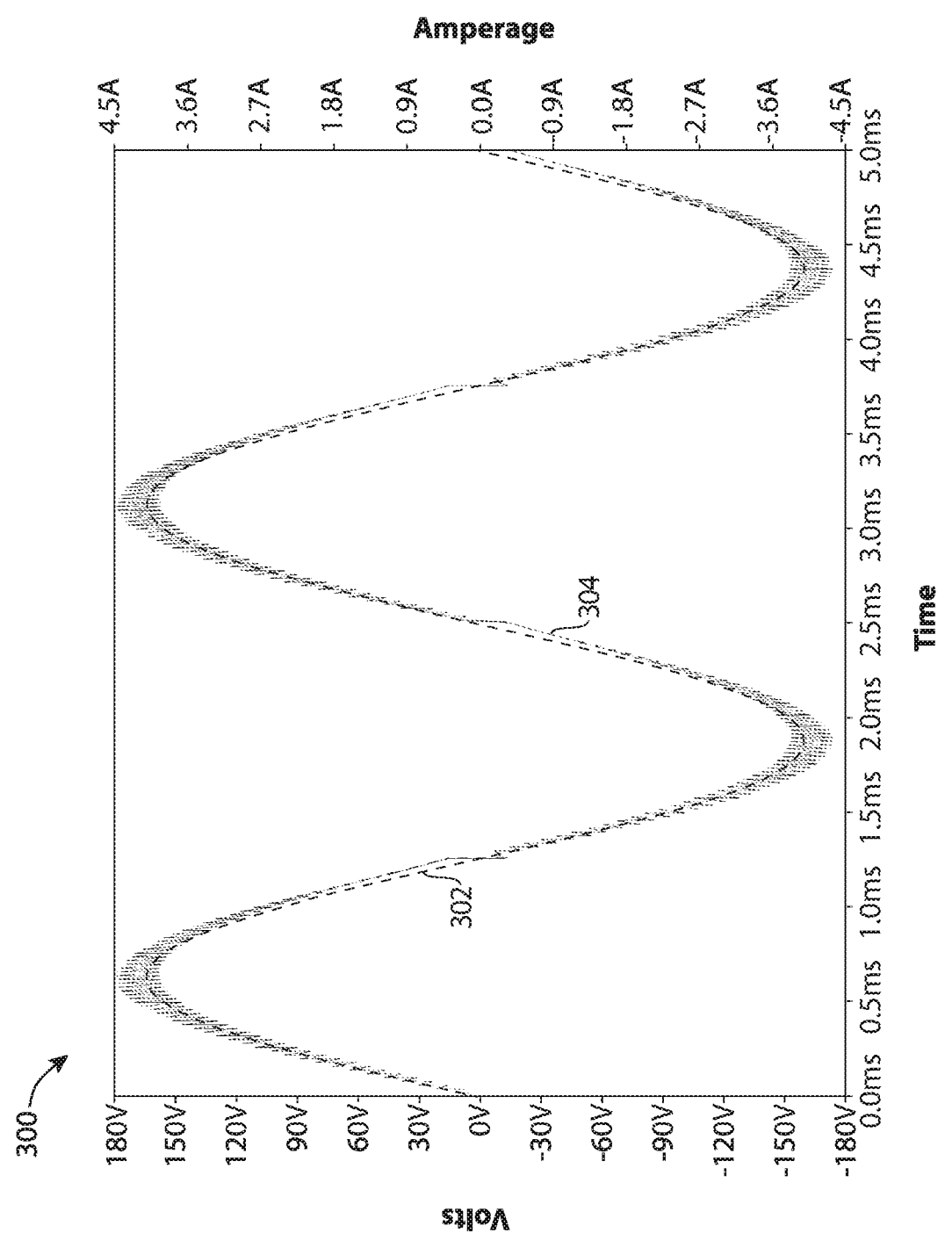
FIG. 4 is a schematic depiction of a simulated waveform plot for the embodiment of the system and RLS of FIGS. 1-2.

With reference now to FIG. 4, a schematic depiction of a simulated waveform plot 300 is shown. Curve 302 depicts an example AC feed voltage source, e.g. from a power supply 111, sent to a UUT, e.g. UUT 2, and distributed to an RLS, e.g. RLS 100, where inductance (L) equals 100 µH, voltage equals 115 VAC and the frequency is 400 Hz. The RLS connected thereto has 3 Amps RMS (root-mean-squared) and a PWM of 50 KHz. Curve 304 depicts an example of the pulse width modulated load current exiting from the RLS at a current output, e.g. output 118. The zero-cross distortion in the load current curve 304 is due to the rate of current change over time (di/dt) decreasing faster than the fly-back voltage can reduce inductor current. A smaller inductor reduces the zero-cross distortion on the load current, but increases the load current ripple at peak AC voltage. Furthermore, a smaller inductor results in smaller on-time of the current regulator. The example above has a PWM on-time of just over 400 nS. This is about the practical limit of a comparator and gate-drive response. In embodiments of the present disclosure, there tends to be a tradeoff between zero-cross distortion in load current and minimum on-time/load current ripple. Those skilled in the art will recognize that there are methods to overcome this tradeoff, but at the expense of complexity. For example, a two-stage RLS could be used.

In general, the reduction in both heat and power source capacity is determined by the efficiency of the regeneration process. For example, a regeneration approach of 90% efficiency means that dissipation is reduced 90% and power source capacity is also reduced by 90%. Embodiments of the present disclosure provide an efficiency better than 95%. Such a reduction enables additional strategies such as integrating load banks into existing test equipment, fixtures or stands, making high-capacity load banks portable, and realizing substantial energy (cost) savings in test. Power supplies, e.g. like power supply 111, that produce source power can also be reduced. Power sources can be reduced sufficiently to negate the need for exotic or custom power supplies, replacing them with readily available off-the-shelf models, and integrating them into the same fixture/stand as other test resources. The embodiments of the present disclosure provide 95% efficiency. This efficiency results in reduced required floor space for load banks, as compared with traditional systems, less source power capacity needed (i.e. off-the-shelf power supplies instead of custom supplies), and reduced electricity costs to provide source power and for air conditioning or other cooling.

The methods and systems of the present disclosure, as described above and shown in the drawings provide for a system for regeneratively testing equipment includes a unit with superior properties including increased efficiency, which results in reduced required space, energy and costs. While the apparatus and methods of the subject disclosure have been shown and described with reference to certain embodiments, those skilled in the art will readily appreciate that change and/or modifications may be made thereto without departing from the scope of the subject disclosure.

What is claimed is:

1. A regenerative load system, comprising:
    a voltage input;
    a load current regulator electrically connected to the voltage input, wherein the load current regulator includes two transistors connected to one another in series configured and adapted to switch OFF together or ON together, synchronously;
    a common gate drive operatively connected to the two transistors of the load current regulator to provide a common output of the common gate drive for PWM voltage control of the two transistors;
    a fly back rectifier electrically connected to the load current regulator, wherein the fly back rectifier includes two transistors connected to one another in series and does not provide for PWM voltage control of the two transistors of the fly back rectifier; and
    a current output electrically connected to the fly back rectifier.

2. The system as recited in claim 1, wherein the transistors are field effect transistors (FETs) connected to one another in series.

3. The system as recited in claim 1, wherein the transistors are field effect transistors (FETs) connected to one another in series.

4. The system as recited in claim 1, wherein, when a first of the two transistors of the fly back rectifier is on, a second transistor of the two transistors of the fly back rectifier is off.

5. The system as recited in claim 1, wherein each transistor of the fly back rectifier is operatively connected to a respective gate drive.

6. The system as recited in claim 1, wherein the voltage input is AC.

7. A system for regeneratively testing electrically powered equipment, the system comprising:
    a power source;
    a unit under test (UUT) having a voltage input electrically connected to the power source; and
    a regenerative load system (RLS) electrically connected to the UUT, comprising:
        a RLS voltage input electrically connected to the UUT;
        a load current regulator electrically connected to the RLS voltage input, wherein the load current regulator includes two transistors connected to one another in series configured and adapted to switch OFF together or ON together, synchronously;
        a common gate drive operatively connected to the two transistors of the load current regulator to provide a common output of the common gate drive for PWM voltage control of the two transistors;
        a fly back rectifier electrically connected to the load current regulator, wherein the fly back rectifier includes two transistors connected to one another in series and does not provide for PWM voltage control of the two transistors of the fly back rectifier; and
        a current output electrically connected to the fly back rectifier, wherein the current output is configured and adapted to provide current to at least one of the UUT or the power source.

8. The system as recited in claim 7, wherein the transistors are field effect transistors (FETs) connected to one another in series.

9. The system as recited in claim 7, wherein the transistors are field effect transistors (FETs) connected to one another in series.

10. The system as recited in claim 7, wherein, when a first of the fly back rectifier transistors is on, a second of the fly back rectifier transistors is off.

11. The system as recited in claim 7, wherein each transistor of the fly back rectifier is operatively connected to a respective gate drive.

12. The system as recited in claim 7, wherein the regenerative load system includes a gate drive operatively connected to the load current regulator for PWM voltage control.

13. The system as recited in claim 7, wherein the power source is AC.

14. A method for regeneratively testing electrically powered equipment, the method comprising:
    outputting a voltage with a unit under test (UUT);
    receiving the voltage with a regenerative load system electrically connected to the UUT;
    regulating current through a load current regulator of the regenerative load system when both of two transistors of the load current regulator are in an ON position, wherein the two transistors of the load current regulator are connected to one another in series and are configured and adapted to switch OFF together or ON together, synchronously, based on a common output from a common gate drive operatively connected to the two transistors to provide for PWM voltage control of the two transistors; and
    receiving current in a voltage input of at least one of a power source or the regenerative load system.

15. The method as recited in claim 14, further comprising allowing the current through a fly back rectifier.

16. The method as recited in claim 15, wherein the fly back rectifier includes two transistors connected to one another in series and does not provide for PWM voltage control of the two transistors of the fly back rectifier.

* * * * *